United States Patent
Ao (10) Patent No.: US 11,504,741 B2
(45) Date of Patent: Nov. 22, 2022

(54) ALIGNED BORON NITRIDE NANOTUBE FILMS

(71) Applicant: Cleveland State University, Cleveland, OH (US)

(72) Inventor: Geyou Ao, Lakewood, OH (US)

(73) Assignee: CLEVELAND STATE UNIVERSITY, Cleveland, OH (US)

( * ) Notice: Subject to any disclaimer, the term of this patent is extended or adjusted under 35 U.S.C. 154(b) by 0 days.

(21) Appl. No.: 16/775,319

(22) Filed: Jan. 29, 2020

(65) Prior Publication Data

US 2021/0162456 A1 Jun. 3, 2021

Related U.S. Application Data (60) Provisional application No. 62/797,966, filed on Jan. 29, 2019.

(51) Int. Cl.

| | | |
|---|---|---|
| *B05D 7/24* | (2006.01) | |
| *B05D 3/00* | (2006.01) | |
| *B82Y 40/00* | (2011.01) | |
| *B82Y 30/00* | (2011.01) | |
| *B01D 61/14* | (2006.01) | |
| *B01D 63/16* | (2006.01) | |
| *B01D 21/26* | (2006.01) | |

(52) U.S. Cl.
CPC ............. *B05D 7/24* (2013.01); *B01D 21/262* (2013.01); *B01D 61/14* (2013.01); *B01D 63/16* (2013.01); *B05D 3/007* (2013.01); *B01D 2311/2676* (2013.01); *B05D 2203/30* (2013.01); *B05D 2401/20* (2013.01); *B82Y 30/00* (2013.01); *B82Y 40/00* (2013.01)

(58) Field of Classification Search
CPC ...... B05D 7/24; B05D 3/007; B05D 2203/30; B05D 2401/20; B82Y 30/00; B82Y 40/00; C01P 2004/13; C30B 29/602; C30B 29/40; C01B 21/064
See application file for complete search history.

(56) References Cited

U.S. PATENT DOCUMENTS

| | | |
|---|---|---|
| 8,206,674 B2 | 6/2012 | Smith et al. |
| 9,394,632 B2 | 7/2016 | Zettl |
| 2003/0106998 A1 | 6/2003 | Colbert et al. |
| 2010/0192535 A1 | 8/2010 | Smith et al. |
| 2013/0119316 A1 | 5/2013 | Sauti et al. |
| 2017/0197832 A1 | 7/2017 | Fathalizadeh et al. |

FOREIGN PATENT DOCUMENTS

WO WO-2019014633 A1 * 1/2019 ........... B01D 61/002

OTHER PUBLICATIONS

Probe-Type Sonication vs. Ultrasonic Bath: An Efficiency Comparison. Product Description [online]. Hielscher Ultrasound Technology, 1999 [retrieved on Feb. 26, 2022]. Retrieved from the Internet: <URL: https://www.hielscher.com/probe-type-sonication-vs-ultrasonic-bath-an-efficiency-comparison.htm>, (Year: 1999).*
Zhi et al., "DNA-Mediated Assembly of Boron Nitride Nanotubes," Chem. Asian J. 2007, 2, 1581-1585. (Year: 2007).*
Mukhopadhyay et al., "Theoretical study of physisorption of nucleobases on boron nitride nanotubes: a new class of hybrid nano-biomaterials," Nanotechnology 21 (2010) 165703. (Year: 2010).*
Gao et al., "Noncovalent Functionalization of Boron Nitride Nanotubes in Aqueous Media Opens Application Roads in Nanobiomedicine," Nanobiomedicine, 2014, 1:7. (Year: 2014).*
Lee et al., "Boron Nitride Nanotubes: Recent Advances in Their Synthesis, Functionalization, and Applications," Molecules 2016, 21, 922. (Year: 2016).*
Alinezhad et al., "A comprehensive theoretical investigation about the bio-functionalization capability of single walled CNT, BNNT, and SiCNT using DNA/RNA nucleobases," Applied Surface Science 422 (2017) 56-72. (Year: 2017).*
Casanova et al., "Enhanced nanoparticle rejection in aligned boron nitride nanotube membranes," Nanoscale, 2020, 12, 21138. (Year: 2020).*
Yanar et al., "Boron Nitride Nanotube (BNNT) Membranes for Energy and Environmental Applications," Membranes 2020, 10, 430. (Year: 2020).*
Kleinerman et al. "Dissolution and Characterization of Boron Nitride Nanotubes in Superacid," Langmuir, 2017, 33 (50), pp. 14340-14346.
Adnan et al. "Extraction of Boron Nitride Nanotubes and Fabrication of Macroscopic Articles Using Chlorosulfonic Acid", Nano Lett. 2018, 18 (3), pp. 1615-1619.
Kim et al., "Hydrogen-Catalyzed, Pilot-Scale Production of Small-Diameter Boron Nitride Nanotubes and Their Macroscopic Assemblies", ACS Nano 2014, 8 (6), pp. 6211-6220.
Fathalizadeh et al., "Scaled Synthesis of Boron Nitride Nanotubes, Nanoribbons, and Nanococoons Using Direct Feedstock Injection into an Extended-Pressure, Inductively-Coupled Thermal Plasma", Nano Lett. 2014. 14 (8), pp. 4881-4886.
Smith et al., "Very Long Single-And Few-Walled Boron Nitride Nanotubes Via the Pressurized Vapor/Condenser Method", Nanotechnology 2009, 20 (50), p. 505604.
Ao et al., "Cholesteric and Nematic Liquid Crystalline Phase Behavior of Double-Stranded DNA Stabilized Single-Walled Carbon Nanotube Dispersions", ACS Nano, vol. 5, No. 2, 1450-1458, 2011.
Kode et al., "Purification and Assembly of DNA-Stabilized Boron Nitride Nanotubes into Aligned Films", ACS Appl. Nano Mater., 2019, 22 pages.

* cited by examiner

*Primary Examiner* — William P Fletcher, III
(74) *Attorney, Agent, or Firm* — Fay Sharpe LLP (57) ABSTRACT

A method for producing an aligned boron nitride nanotube film includes drying a dispersion containing boron nitride nanotubes, a biopolymer, and a solvent.

20 Claims, 13 Drawing Sheets

ALIGNED BORON NITRIDE NANOTUBE FILMS

The present application claims the priority benefit of U.S. Provisional Patent Application Ser. No. 62/797,966, filed Jan. 29, 2019 and titled "Aligned Boron Nitride Nanotube Films" and the contents of which are incorporated by reference herein.

BACKGROUND

The present disclosure relates to aligned boron nitride nanotube (BNNT) films as well as methods of making the films, compositions used to make the films, and products containing the films.

BNNTs have promising optical, mechanical, and thermal properties for applications development in thermal interface materials, electronic and optoelectronic devices, energy harvesting, catalysts, nanomedicine, and advanced composite materials. The one-dimensionality and symmetry restrictions in high-aspect-ratio BNNTs, resembling that of carbon nanotubes, render new structural characteristics and unique properties that are not available in many existing nanomaterials. Compared to electronic structures of single-wall carbon nanotubes (which can be metals, quasi-metals, or semiconductors), BNNTs generally behave as wide bandgap semiconductors independent of wall number and chirality. In addition, BNNTs are stable under air oxidation up to 900° C. and have optical absorbance and fluorescence features in the ultraviolet range. BNNTs also have the ability to absorb neutron radiation. These distinct properties make BNNTs one of the most promising material candidates for producing multifunctional, protective films with remarkable thermal and chemical stabilities and ultraviolet and neutron radiation shielding.

Scalable synthesis of BNNTs via a high-temperature-pressure process produces a mixture of few-wall BNNTs and large percentages of non-nanotube impurities (e.g., elemental boron, boron oxide ($B_2O_3$), and hexagonal boron nitride (hBN) structures such as nanosheets and nanoshells). Post-synthesis purification of BNNTs has been focused on the removal of elemental boron. Nanotube alignment is also an important factor for obtaining assembled solid materials with improved properties.

It would be desirable to develop new aligned boron nitride nanotube films and methods of making the same.

BRIEF DESCRIPTION

Disclosed, in some embodiments, is a method for forming an aligned boron nitride nanotube film. The method includes evaporating a solvent contained in a dispersion. The dispersion includes boron nitride nanotubes; DNA; and the solvent.

In some embodiments, the DNA is single-stranded DNA which is optionally represented by the following formula: $(GT)_n$ wherein G is guanine wherein T is thymine; and wherein n is a number of repeating units of at least 3 and at most 40.

The method may further include depositing the dispersion on a substrate prior to the evaporating. In some embodiments, the substrate includes at least one substrate material selected from the group consisting of a silicon wafer, copper, polytetrafluoroethylene, glass, and mica.

In some embodiments, the method further includes purifying dispersion prior to the evaporating.

The purifying may include membrane filtration and/or centrifuging the dispersion.

In some embodiments, the method further includes mixing the boron nitride nanotubes, the single-stranded DNA, and the solvent to form the dispersion.

The mixing may include probe tip ultrasonication.

In some embodiments, the purified dispersion contains DNA-bound boron nitride nanotube hybrids in an amount of from about 0.03 mass % to about 11.5 mass % of the boron nitride nanotube hybrids.

A mass ratio of the boron nitride nanotubes to the single-stranded DNA may be in the range of about 1:1 to about 1:2 or about 1:1 to about 2:1.

In some embodiments, the solvent comprises deionized water and/or one or more alcohols.

Disclosed, in other embodiments, is a method for forming an aligned boron nitride nanotube film. The method includes mixing boron nitride nanotubes, DNA, and a solvent to form a dispersion; purifying the dispersion to remove impurities; depositing the purified dispersion onto a substrate; and evaporating at least a portion of the solvent to form the aligned film on the substrate.

Disclosed, in further embodiments, is an aligned boron nitride nanotube film produced by a process comprising: evaporating a solvent contained in a dispersion, the dispersion comprising: boron nitride nanotubes; DNA and the solvent.

In some embodiments, the dispersion is purified prior to the evaporating; and wherein the purified dispersion comprises from about 0.03 mass % to about 11.5 mass % of DNA-bound boron nitride nanotube hybrids.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

The present disclosure may be understood more readily by reference to the following detailed description of desired embodiments included therein and the drawings. In the following specification and the claims which follow, reference will be made to a number of terms which shall be defined to have the following meanings.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent can be used in practice or testing of the present disclosure. All publications, patent applications, patents, and other references mentioned herein are incorporated by reference in their entirety. The materials, methods, and articles disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases that require the presence of the named ingredients/steps and permit the presence of other ingredients/steps. However, such description should be construed as also describing compositions, mixtures, or processes as "consisting of" and "consisting essentially of" the enumerated ingredients/steps, which allows the presence of only the named ingredients/steps, along with any impurities that might result therefrom, and excludes other ingredients/steps.

Unless indicated to the contrary, the numerical values in the specification should be understood to include numerical values which are the same when reduced to the same number of significant figures and numerical values which differ from the stated value by less than the experimental error of the conventional measurement technique of the type used to determine the particular value.

All ranges disclosed herein are inclusive of the recited endpoint and independently combinable (for example, the range of "from 2 to 10" is inclusive of the endpoints, 2 and 10, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

Figure 1:
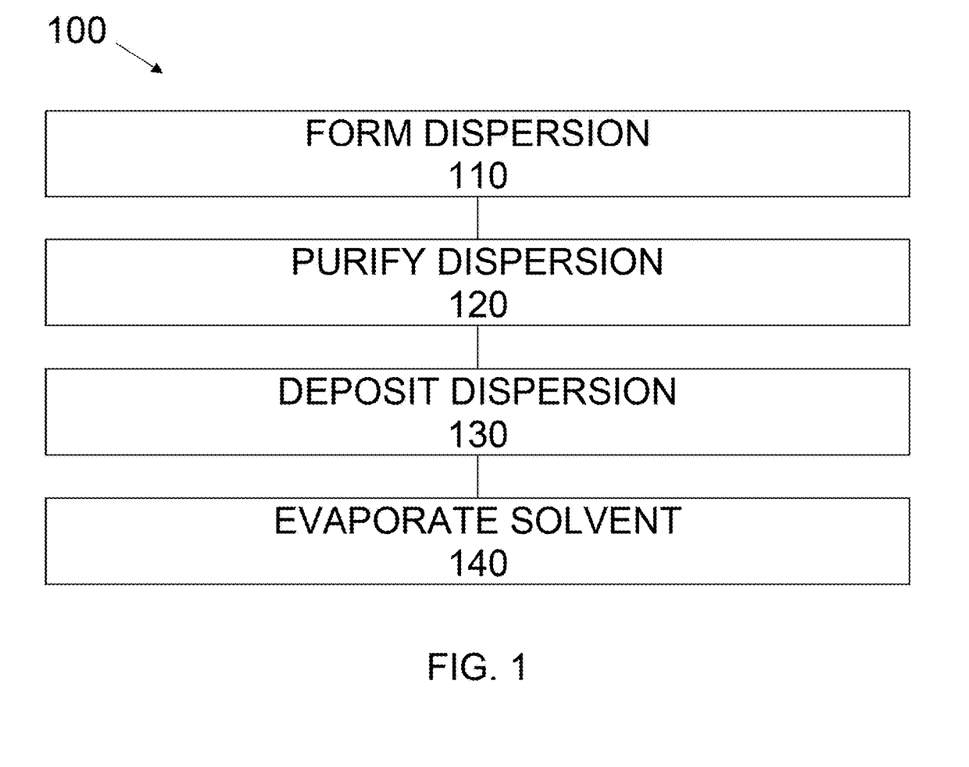
FIG. 1 is a flow chart illustrating an aligned boron nitride nanotube film formation method in accordance with some embodiments of the present disclosure.

FIG. 1 illustrates a non-limiting embodiment of a method 100 in accordance with some embodiments of the present disclosure. The method includes forming a dispersion 110 containing a solvent, boron nitride nanotubes (BNNTs), and a biopolymer; purifying the dispersion 120; depositing the dispersion on a substrate 130; and evaporating the solvent 140 to form an aligned layer.

The dispersion may be formed 110 in a mixer. In some embodiments, the dispersion is formed via sonication (e.g., ultra-sonication). Sonication involves applying sound energy to agitate particles. Ultrasonication is sonication wherein the sound waves have a frequency exceeding the upper audible limit of human hearing. In some embodiments, the sound waves have a frequency of at least 20 kHz.

In other embodiments, the sonication is a mild bath sonication (Fisher Scientific, Ultrasonic Bath 5.7 L).

Sonication may be performed for a time period in the range of about 0.1 to about 50 hours, including from about 0.5 to about 40 hours, from about 1 to about 30 hours, and from about 6 to about 24 hours.

The BNNTs are not individually soluble in water or almost any other solvent. However, the inclusion of the biopolymer leads to the formation of BNNT-biopolymer hybrids which are dispersible.

The BNNTs may include 1-5 walls. In some embodiments, a majority of the BNNTs have 2 or 3 walls.

In some embodiments, the BNNTs have a diameter of from about 1 nm to about 100 nm, including from about 5 nm to about 10 nm.

The BNNTs may have a length in the range of from a few hundred nm up to about 200 microns.

In some embodiments, the biopolymer is DNA. The DNA may be single-stranded DNA or double-stranded DNA.

In some embodiments, the single stranded DNA is represented by the following formula: $(GT)_n$, wherein n is the number of repeated units. n may be in the range of from about 2 to about 100, including from about 3 to about 40.

In other embodiments, the biopolymer is RNA.

The biopolymer may be a polypeptide.

The solvent may be selected from water and/or one or more alcohols. In some embodiments, the alcohol is selected from ethanol, methanol, isopropyl alcohol, and a mixture of any combination of two or more thereof.

Combinations of water and one or more alcohols are expressly contemplated.

In some embodiments, the method 100 does not include the formation 110. In these embodiments, the dispersion may have been formed and provided prior to the method.

The purification 120 may remove non-nanotube impurities. Non-limiting examples of non-nanotube impurities include elemental boron and hBN structures.

In some embodiments, the purification 120 includes at least one of membrane filtration and centrifugation.

In some embodiments, the method 100 does not include purification.

The optionally purified dispersion may be deposited 130 on a substrate. Non-limiting examples of substrates include silicon wafers, copper, polytetrafluoroethylene, glass, and mica.

Figure 2:
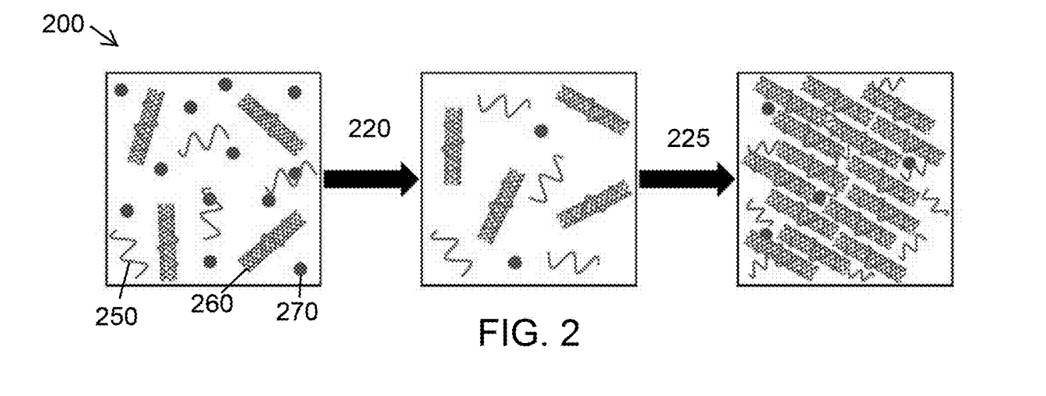
FIG. 2 is an illustration of a non-limiting example of an assembly process of DNA-stabilized BNNT hybrids (DNA-BNNTs) in accordance with some embodiments of the present disclosure.

FIG. 2 is a schematic illustration of a purification and assembly process 200 in accordance with some embodiments of the present disclosure. The composition includes DNA 250, boron nitride nanotubes 260, and impurities 270 in a solvent. The composition is purified 220 to remove impurities and then assembled 225 into an aligned film when the solvent is removed.

The compositions and methods of the present disclosure may be suitable for achieving spontaneous self-alignment of the nanotubes instead of requiring directed assembly. Also, processing may be performed with mixtures of other materials such as cellulose nanocrystals and polymers to produce composite materials of aligned nanotubes on a broad concentration range of nanotubes from dilute to highly concentrated.

Boron nitride nanomaterials include both one-dimensional (1D) boron nitride nanotubes and two-dimensional (2D) hexagonal boron nitride nanosheets.

Although much of the disclosure is described with respect to BNNTs, it should be understood that dispersions of hBN nanosheets stabilized by DNA in water and water/alcohol mixtures are also expressly contemplated.

The following examples are provided to illustrate the devices and methods of the present disclosure. The examples are merely illustrative and are not intended to limit the disclosure to the materials, conditions, or process parameters set forth therein.

EXAMPLES

Experimental Procedures

Boron nitride nanotubes (BNNTs, Puff Ball, lot no: 44171) synthesized by the high-temperature-pressure (HTP) method were purchased from BNNT, LLC. Custom-made DNA was purchased from Integrated DNA Technologies. Sodium chloride (NaCl, Sigma-Aldrich), sodium thiocyanate (NaSCN, Sigma-Aldrich), and polyethylene glycol (PEG, MW 6 kDa, Alfa Aesar) were used as received.

BNNT dispersion and purification by membrane filtration: For dispersion of BNNTs with a given DNA sequence, a total volume of 1 mL of the DNA and as-synthesized BNNT mixture material in deionized (DI) water with 0.1 mol/L NaCl was bath sonicated at room temperature for 1 h followed by a probe tip ultrasonication with a 2 mm diameter probe in an ice bath for 1 h at a power level of 8 W (model VCX 130, Sonics and Materials, Inc.). The BNNTs/DNA mass ratio was varied from BNNTs:DNA=1:0 up to 1:6 while keeping the BNNT mixture concentration constant at 1 mg/mL. Bath sonication was used to loosen the BNNT puff balls, while the majority of BNNT materials remained undispersed. After tip sonication, brown colored dispersions were obtained, which are composed of individually dispersed DNA-BNNT hybrids as well as small and large bundles of nanotubes and impurities. However, nanotubes did not disperse in the absence of DNA after tip sonication. To remove large BNNT bundles and undispersed impurities, sonicated samples were centrifuged at 19° C. and 17,000 g in 100 µL aliquots for 90 min. The supernatant was collected and used as a stock DNA-BNNT dispersion. The purification of BNNTs from non-nanotube structures remaining in the supernatant was performed using a membrane filtration method. Specifically, the stock DNA-BNNT supernatant was purified using a Microcon® centrifugal filter with a molecular weight cutoff (MWCO) of 30 kDa by centrifugation at 19° C. and 17,000 g for 15 min. The leftover sample in the filter was washed with DI water 3 times before re-dispersing in water by vortex mixing. The purification yield of DNA-BNNT hybrids is ≈19.6%. The estimation of the % yield of purified DNA-BNNT hybrids is calculated over the total mass of a synthetic BNNT mixture in the starting material, which contains roughly 45-50 mass % of non-nanotube impurities. For improved stability of purified DNA-BNNT dispersion for long-term storage or concentrating to obtain macroscopic films, an additional amount of DNA was added to a final concentration of 100 µg/mL and bath sonicated at room temperature for 30 min. All BNNTs/DNA ratios of various nanotube dispersions are reported in mass ratios.

UV-vis absorbance measurements: The UV-vis absorbance measurements were performed on a Shimadzu UV-2600/Jasco V-760 spectrophotometer over the wavelength range of 185-800 nm using a 10 mm path length quartz cuvette. Absorbance spectra were plotted up to ≈400 nm due to the fact that absorption peaks of aqueous dispersion of BNNT synthetic materials were observed in the UV region. Excess DNA not bound to BNNTs was removed from the sample by a precipitation method previously reported for carbon nanotubes to allow for resolution of BNNT absorption features in the UV region. Specifically, final concentrations of 1 mol/L NaSCN and 6 mass % PEG were added to the sample, and the mixture was incubated overnight at 4° C. and then centrifuged at 17000 g for 30 min. After centrifugation, the supernatant was removed, and the pellet was re-dispersed in water by bath sonication for 30 min.

Thermogravimetric analysis (TGA): The percentage of impurities and thermal stability of a synthetic BNNT material was tested by the thermal gravimetric analyzer (TA instruments Q50 series) by heating a BNNT puff ball up to 1000° C. under dry air at 20° C./min ramp. The system was equilibrated to reduce the momentum created by the ramping temperature to the successive isothermal step. Isothermal temperatures were maintained at 120° C. and 240° C. for 15 min and at 425° C. for 25 min in order to ensure the maximum removal or oxidation of various components of the synthetic BNNT material, such as a moisture content, elemental boron, and boron oxide ($B_2O_3$) at critical temperatures.

Scanning electron microscopy (SEM): High-resolution field emission scanning electron microscope Inspect F50 by FEI, equipped with an Everhart-Thornley detector with variable grid bias was used to characterize dispersed DNA-BNNT hybrids as well as aligned DNA-BNNT films. The gold sputtered silicon wafer substrate was used to image dilute dispersions of DNA-BNNTs. For the densely packed DNA-BNNT films a bare silicon substrate was used instead, which was plasma treated to promote uniform transfer of the films to the substrate. The sample was scribed to reveal the underside of the film. SEM imaging was performed at 5 kV.

Optical microscopy: Optical microscopy was performed on an Olympus BX51W1 optical microscope with a Hamamatsu ORCA-R2 digital deep-cooled CCD camera (C10600) using precleaned glass slides and coverslips. Images of dilute and concentrated dispersions of DNA-BNNT hybrids were taken in transmission with and without cross-polarized light using 20× and 40× objectives.

Formation of DNA-BNNT films by evaporation: A total of 20 mL stock DNA-BNNT dispersion was purified by membrane filtration and was concentrated 10 times to obtain a total volume of 2 mL concentrated dispersion. An additional amount of corresponding $(GT)_{20}$ DNA was added to a final concentration of 0.1 mg/mL to maintain the dispersion stability of DNA-BNNTs at higher concentrations of nanotubes. This yields a mass ratio of free DNA:DNA-BNNT hybrids 1.1:1 in the dispersion. The vial containing 2 mL sample was placed on a stir table with a rotational speed between 100-150 rpm at room temperature. In addition, the mass of solvent evaporated was tracked to calculate the concentration of DNA-BNNT hybrids. The dried BNNT film was obtained by evaporation of ≈11.5 mass % DNA-BNNT dispersion on a plasma treated silicon substrate which was later imaged under SEM.

Results

Figure 3A:
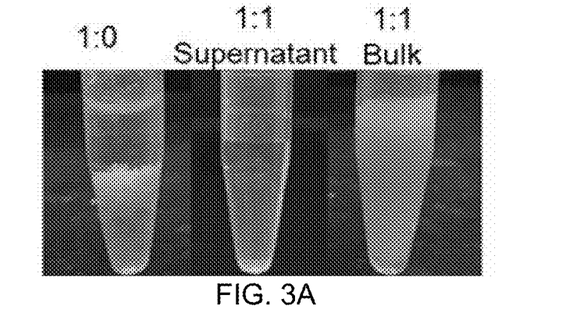
FIG. 3A is photographs of aqueous dispersions of a synthetic BNNT material that are noncovalently complexed with DNA at different mass ratios before and after centrifugation.
Figure 3B:
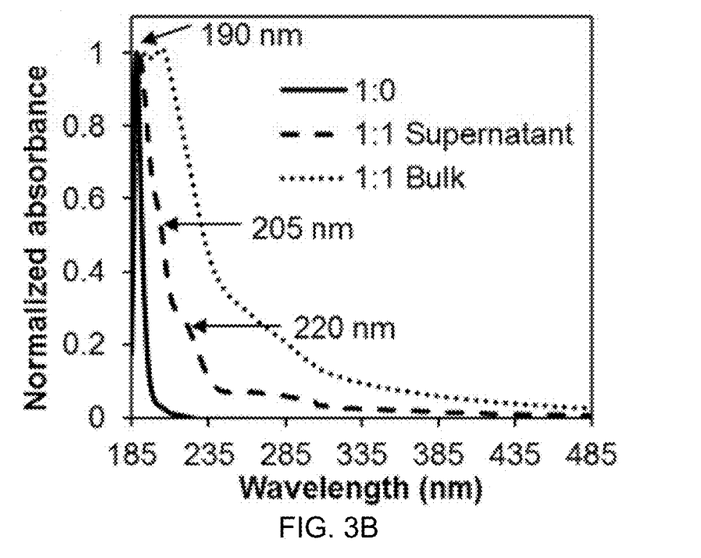
FIG. 3B is a graph showing the corresponding absorbance spectra of the dispersions.
Figure 3C:
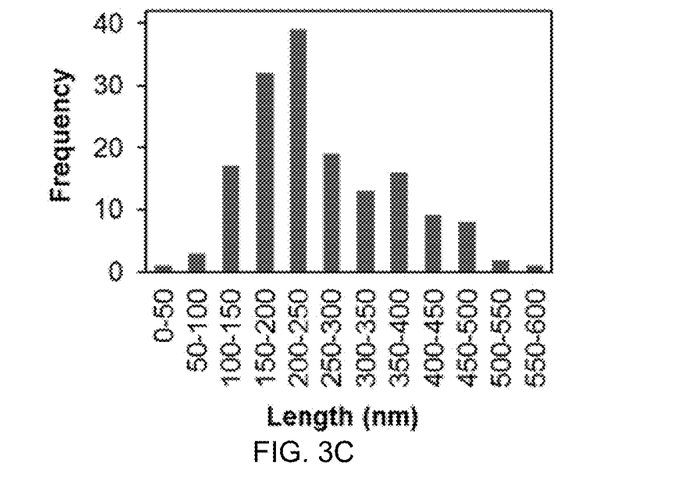
FIG. 3C is a histogram of the length distribution of DNA-BNNT hybrids by measuring the lengths of 200 nanotubes imaged by scanning electron microscope (SEM).

Sequences composed of G/T nucleotides led to effective dispersions of DNA-BNNTs and the length of $(GT)_n$ had relatively little effect on the dispersion yield. Dispersions containing single-stranded $(GT)_{20}$ DNA and BNNTs were prepared at various BNNTs/DNA mass ratios. Aqueous dispersions of BNNTs were prepared by probe tip ultrasonication by adding different amounts of DNA while keeping a 1 mg/mL concentration of as-synthesized BNNT mixture material. The supernatant of DNA-BNNTs was collected following centrifugation and used as stock DNA-BNNT dispersions. The capability of DNA to disperse BNNTs individually in various solvents based on its potential π-π interactions was studied. FIG. 3A compares aqueous dispersions of DNA-BNNTs prepared by three different methods: BNNTs:DNA=1:0 without adding DNA, a bulk dispersion of BNNTs:DNA=1:1 without centrifugation, and a supernatant of BNNTs:DNA=1:1 collected after centrifugation. It was apparent that the dispersion of BNNTs was obtained with the assistance of DNA in an aqueous environment. The centrifugation step enabled the removal of the majority of bundled BNNTs and impurities as shown in FIG. 3B. FIG. 3C shows the length distribution of individually dispersed DNA-BNNT hybrids from a supernatant BNNTs:DNA=1:1 sample by SEM and the number average length of hybrids was estimated to be 268±110 nm.

Figure 4A:
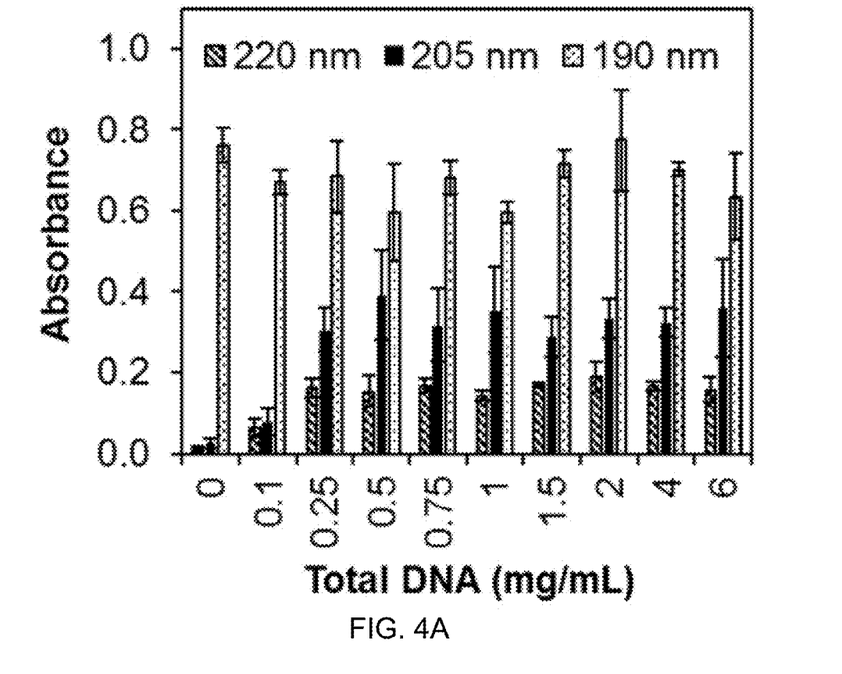
FIG. 4A is a graph showing absorbance values of characteristic peaks for supernatant dispersions of DNA-BNNTs at BNNTs:DNA mass ratios from 1:0 to 1:6.
Figure 4B:
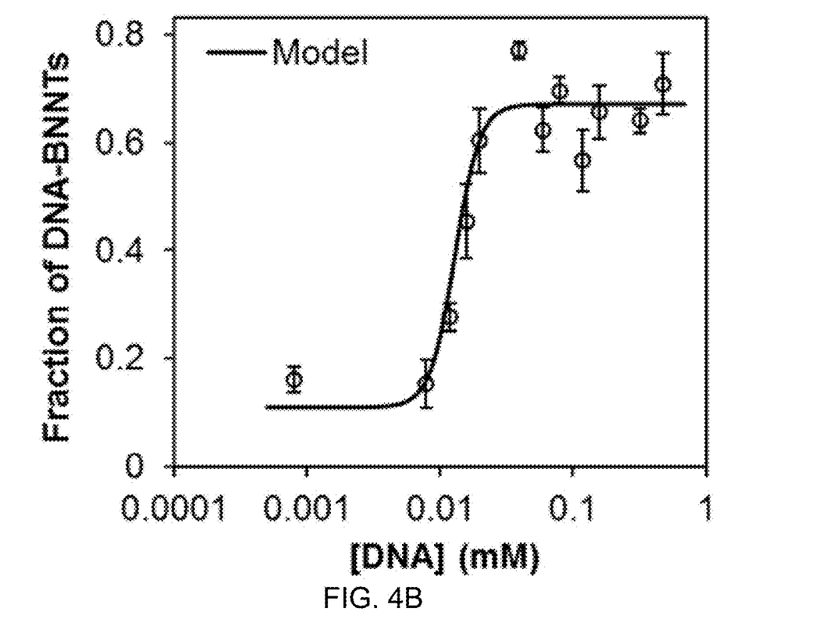
FIG. 4B is a graph showing the fraction of DNA-BNNT hybrids in supernatant dispersions as a function of DNA molar concentration.

The effective BNNTs/DNA mass ratio for dispersing as-synthesized BNNTs was evaluated. FIG. 4A shows average absorbance values of characteristic peaks observed at 190, 205, and 220 nm wavelengths for supernatant dispersions of DNA-BNNTs with increasing concentrations of DNA at different mass ratios from 1:0 to 1:6. FIG. 4B shows the fraction of DNA-BNNT hybrids in supernatant dispersions as a function of DNA molar concentration. All samples were diluted by a factor of 100× in deionized water for UV-vis absorbance measurements. The error bars were obtained from the standard deviation of a minimum of three repeats.

Figure 5:
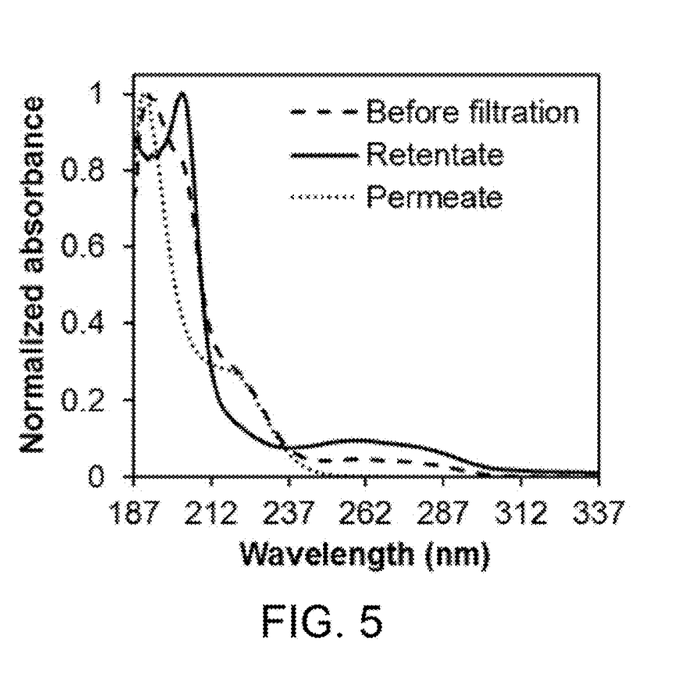
FIG. 5 is a graph showing normalized absorbance spectra of $(GT)_{20}$-BNNT aqueous dispersions before and after membrane filtration of a supernatant dispersion of BNNTs: DNA=1:1 (mass basis) using a centrifugal filter with a molecular weight cutoff of 30 kDa.

Purification of aqueous dispersions of DNA-BNNTs via a membrane filtration method and assembly of aligned DNA-BNNT films from a concentrated and purified dispersion were demonstrated. FIG. 5 illustrates normalized absorbance spectra of aqueous dispersions of $(GT)_{20}$-BNNTs before and after membrane filtration with a concentrated stock of BNNTs:DNA=1:1 by using a centrifugal filter with a molecular weight cut off of 30 kDa. A dominant absorption peak at 205 nm in retentate sample corresponds to that of a DNA-BNNT hybrid. Additionally, the decrease in characteristic peaks at 190 and 220 nm indicate the effective removal of impurities such as boron particles and hBN structures.

Figure 6A:
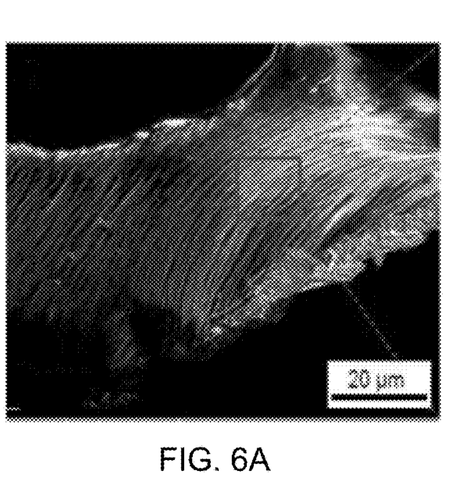
FIG. 6A is a SEM image of an aligned DNA-BNNT film formed by solvent evaporation of purified dispersions of BNNTs:DNA=1:0.75 mass ratio (≈11.5 mass % of DNA- BNNT hybrids) without applied shear.
Figure 6B:
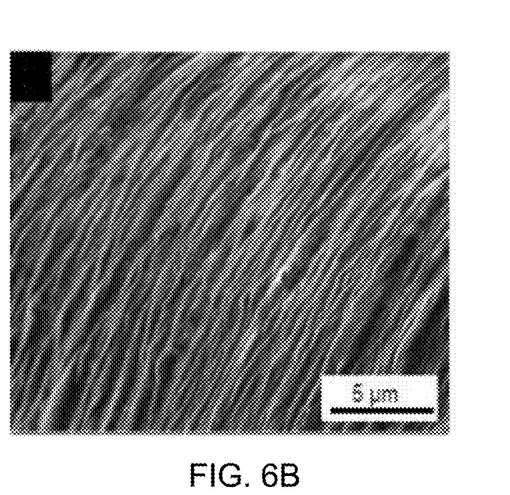
FIG. 6B shows the surface morphology of the film and the alignment of densely packed nanotube bundles.

Next, analysis was conducted with a scanning electron microscope. Notably, uniform dispersions of nanotubes were maintained when evaporating a low concentration dispersion of purified $(GT)_{20}$-BNNTs containing an excess of DNA to as high as 11.5 mass % of DNA-BNNT hybrids. Allowing purified dispersions to dry on a silicon wafer substrate resulted in solid BNNT films. FIGS. 6A and 6B are SEM images showing surface morphology of the film revealing an aligned, densely packed structure composed of DNA/BNNT bundles after solvent removal.

Figure 7A:
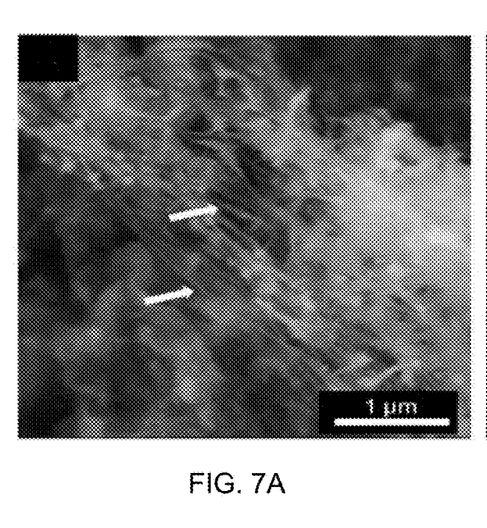
FIG. 7A is a SEM image of a synthetic BNNT material where arrows indicate nanotubes.
Figure 7B:
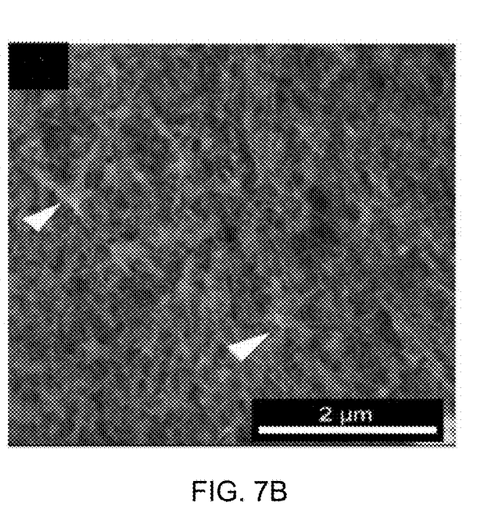
FIG. 7B is a SEM image where arrowheads represent impurities in the form of star-shaped structures in a synthetic material.

FIGS. 7A and 7B illustrate as-synthesized BNNT material wherein the nanotube structures are highlighted with arrows and the presence of impurities are highlighted with arrowheads.

Figure 8A:
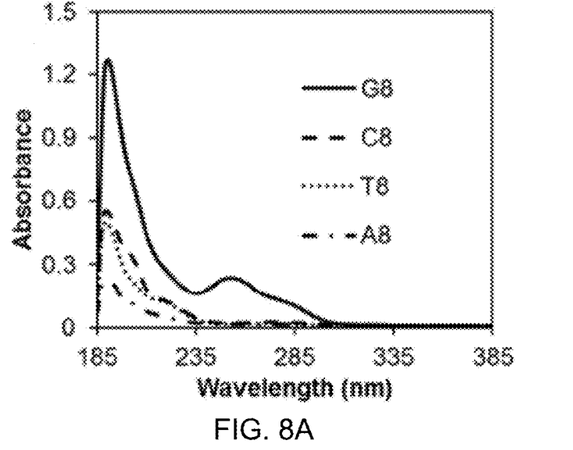
FIG. 8A is a graph showing absorbance spectra of BNNTs dispersed by 8-mer single-mononucleotide repeats with 0.1 mol/L NaCl.
Figure 8B:
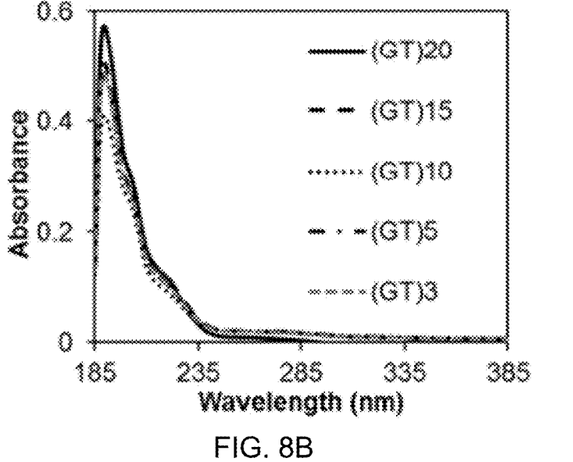
FIG. 8B is a graph showing absorbance spectra of BNNTs dispersed by $(GT)_n$ sequences of varied lengths with 0.1 mol/L NaCl.
Figure 8C:
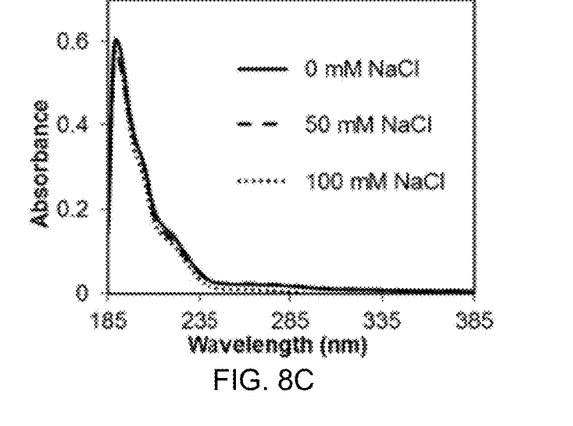
FIG. 8C is a graph showing absorbance spectra of BNNTs dispersed by $(GT)_{20}$ with final NaCl concentrations of 0, 50, and 100 mM.

FIGS. 8A, 8B, and 8C show absorbance spectra for BNNTs dispersed by 8-mer single-mononucleotide repeats at 0.1 mol/L NaCl, $(GT)_n$ sequences of varied lengths at 0.1 mol/L NaCl, and $(GT)_{20}$ with final NaCl concentrations at 0, 50, and 100 mM, respectively. All samples were diluted by a factor of 100× in deionized water for UV-vis absorbance measurements.

Figure 9A:
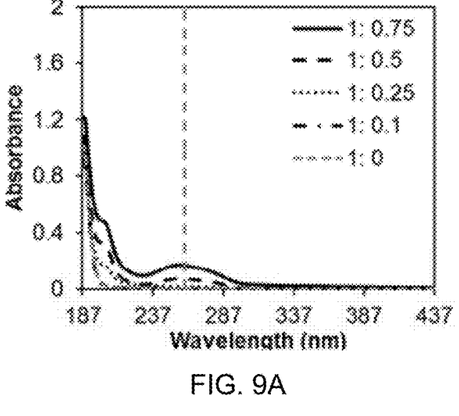
FIGS. 9A and 9B are graphs showing absorbance spectra of supernatant $(GT)_{20}$-BNNT dispersions at varying BNNTs/DNA mass ratios without removing excess unbound DNA.
Figure 9B:
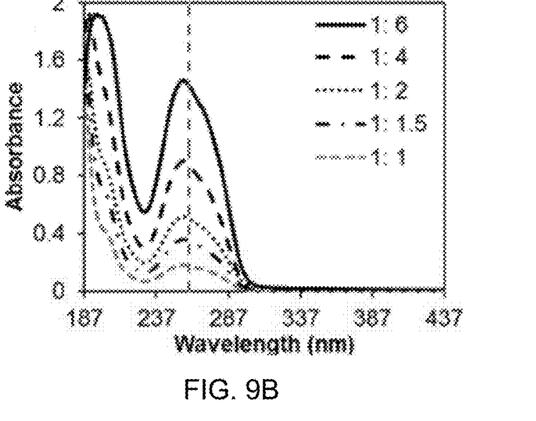
Figure 9C:
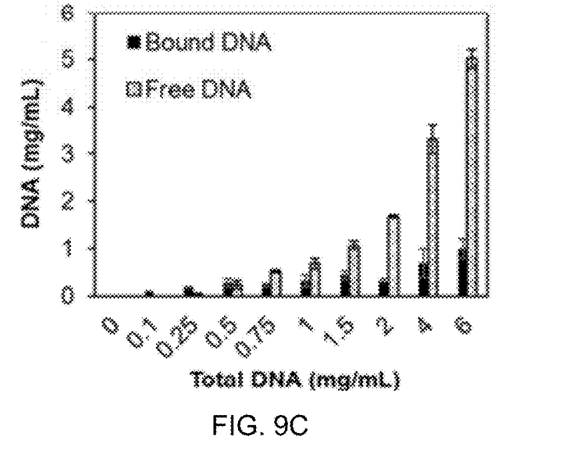
FIG. 9C is a bar chart representing concentrations of free DNA and bound DNA in DNA-BNNT dispersions.

FIGS. 9A and 9B shows absorbance spectra of un-precipitated $(GT)_{20}$-BNNT dispersions at varying BNNTs/DNA mass ratios, where the dotted line indicates the absorption peak of free DNA at 260 nm. All samples were diluted by a factor of 100× in deionized water for measurements. FIG. 9C is a bar chart representing concentrations of free DNA and bound DNA in DNA-BNNT dispersions. Error bars were generated from the standard deviation of three repeats. All samples were diluted by a factor of 100× in deionized water for UV-vis absorbance measurements.

Figure 10A:
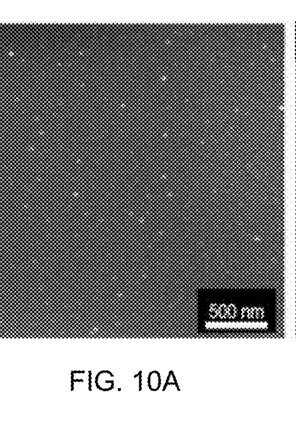
FIG. 10A is a SEM image of BNNT dispersions without adding $(GT)_{20}$ DNA showing no evidence of nanotube dispersion.
Figure 10B:
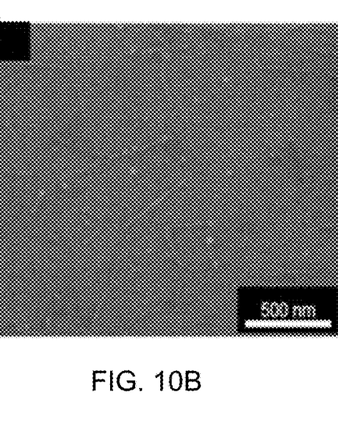
FIG. 10B is a SEM image of a supernatant with adding $(GT)_{20}$ DNA showing individually dispersed nanotubes.

FIGS. 10A and 10B, respectively, are SEM images of BNNT dispersions with and without adding $(GT)_{20}$ DNA. FIG. 10A at BNNTs:DNA=1:0 shows no evidence of nanotube dispersion. In contrast, the supernatant BNNTs:DNA=1:1 shows individually dispersed nanotubes in FIG. 10B. Both samples were imaged without further dilution.

Figure 11A:
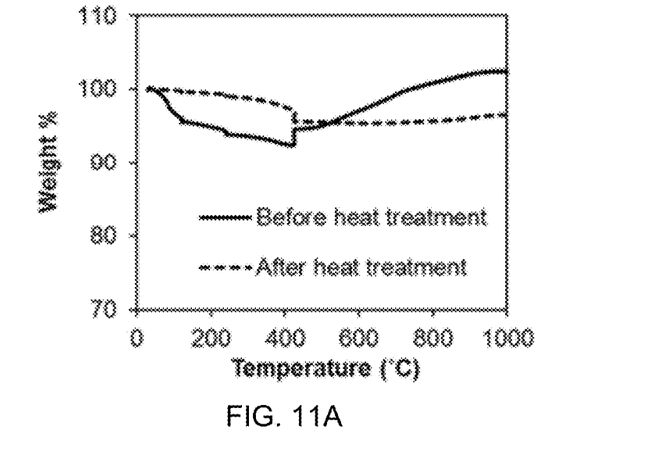
FIG. 11A is a graph showing thermogravimetric analysis (TGA) of synthetic BNNT materials before and after heat treatment for purification purpose.
Figure 11B:
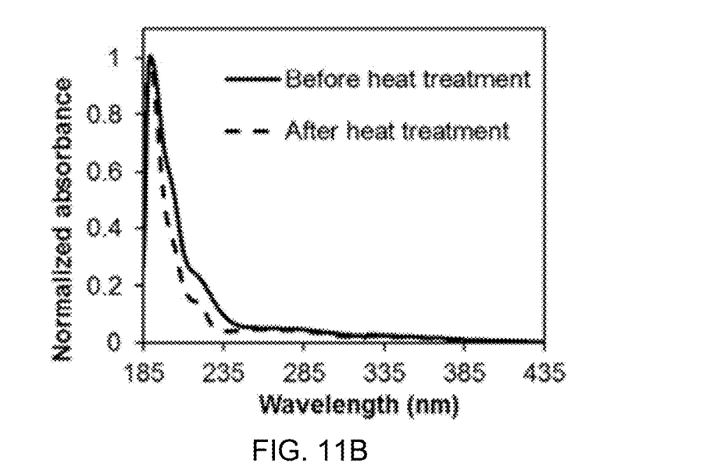
FIG. 11B is a graph showing absorbance spectra of DNA:BNNT=1:1 mass ratio dispersions using $(GT)_{20}$.
Figure 11C:
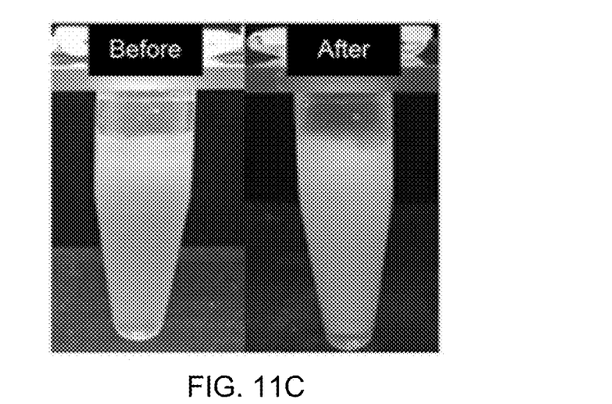
FIG. 11C is two photographs corresponding to the dispersions.

Heat treatment of as-synthesized BNNTs was performed by baking a synthetic material up to 425° C. in an oven for three days followed by washing the baked sample with methanol to remove boron oxide ($B_2O_3$). FIG. 11 is a comparison of BNNT materials before and after heat treatment including A TGA analysis of synthetic BNNT materials, B normalized absorbance spectra of DNA:BNNT=1:1 dispersions using $(GT)_{20}$, and C photographs of the corresponding dispersions. FIG. 11B shows no significant differences between DNA-BNNT dispersions using a synthetic material before and after heat treatment, indicating that heat treatment is not an effective way of purifying a synthetic BNNT material.

Figure 12A:
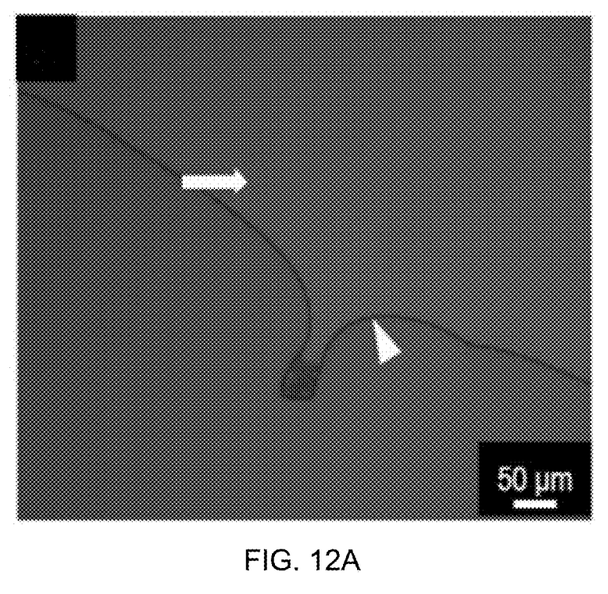
FIG. 12A is an optical microscope image of a membrane-filtered DNA-BNNT dispersion at 0.15 mass % of DNA-BNNT hybrids.
Figure 12B:
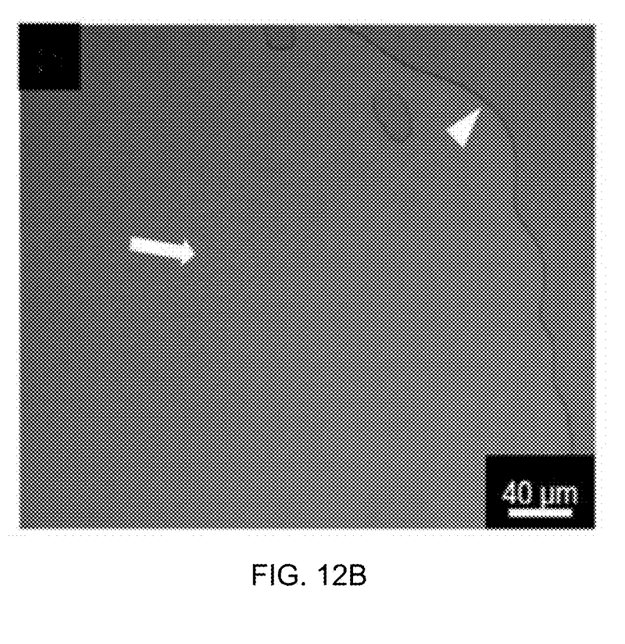
FIG. 12B is an optical microscope image of a membrane-filtered DNA-BNNT dispersion with 11.5 mass % of DNA-BNNTs. Arrows point to the region of aqueous DNA-BNNT dispersions and arrowheads indicate the boundary of DNA-BNNT dispersions.

FIG. 12 includes optical microscope images of membrane-filtered DNA-BNNT dispersions at A 0.15 mass % of DNA-BNNT hybrids and B 11.5 mass % of DNA-BNNT hybrids. A texture resembling that of wavy patterned sand was observed at high concentration dispersions of 11.5 mass % of DNA-BNNT hybrids, indicating a potential increase in alignment of nanotubes with increasing concentration. Arrows point to the region of aqueous DNA-BNNT dispersions and arrowheads indicate the boundary of DNA-BNNT dispersions.

Figure 13A:
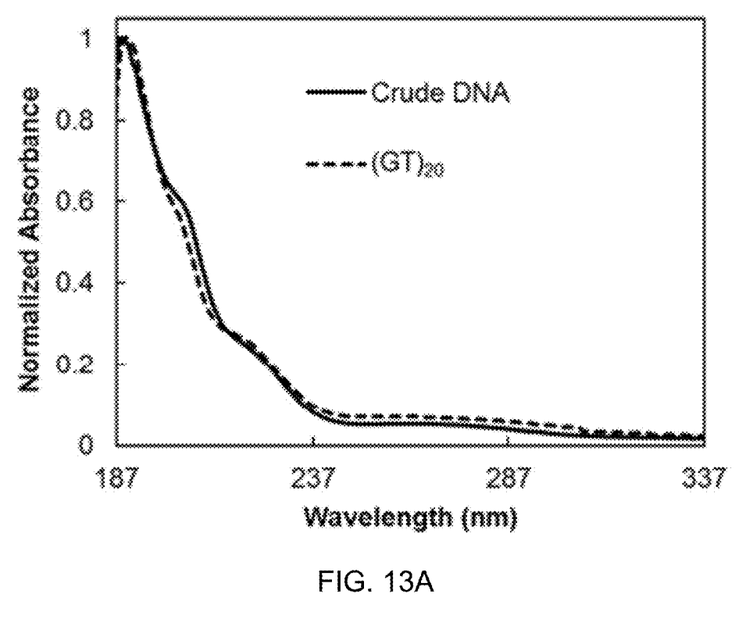
FIGS. 13A and 13B are graphs showing UV absorbance spectra of BNNTs dispersed in crude DNA (herring sperm—crude oligonucleotides, <50 bp, Sigma Aldrich, D3159) compared to $(GT)_{20}$.
Figure 13B:
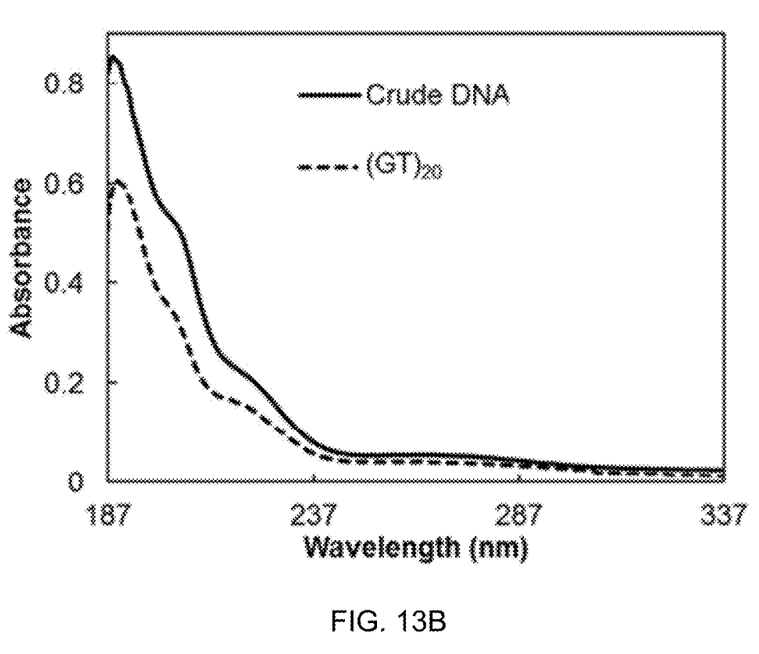

FIG. 13 includes graphs showing UV absorbance data of BNNTs dispersed in crude DNA. The DNA source was from herring sperm (crude oligonucleotides, <50 bp, Sigma Aldrich, D3159). Samples in FIG. 13B were diluted by a factor of 100× in deionized water for UV-vis absorbance measurements.

Dispersions in Water and Mixtures of Water and Alcohol

Dispersions of boron nitride nanotubes utilizing DNA in water and mixtures of water and alcohol at various alcohol contents (10-90 percent by volume) were produced. When using alcohol/water mixtures, a mild bath sonication for 6-24 hours was effective in dispersing boron nitride nanotubes instead of using harsh tip sonication, which produces shorter nanotubes.

A mild bath sonication provides a lower ultrasonic power input of approximately 20 W/L (<100 W/L, <50 W/L, <40 W/L, <30 W/L), which is about 1000 times lower than that of a typical probe tip sonication. The sonication energy for an ultrasonic bath is low and distributes over a large volume of liquid medium in the tank.

For certain applications such as nanocomposites, films, and fiber spinning, parameters including nanotube length, type, impurity, and alignment affect the resulting material performance. Long nanotubes (>0.2 μm, preferably >1 μm) are desirable for improved properties such as strength and electrical and thermal conductivity.

For the initial step of dispersions, alcohol/water mixtures with 30-60% alcohol content effectively disperse DNA-BNNTs. Once DNA binds to the surface of BNNTs, the solvent can be exchanged to water, alcohol/water mixtures, and even alcohol only. This dispersion method developed for BNNTs is also directly applicable for exfoliating hBN (Momentive Performance Materials, powder, grade AC6004), 2D allotrope of BNNTs, to single- and few-layered nanosheets. In addition to their potential applications, such as thermal interface material, electronic and optoelectronic devices, energy harvesting and advanced composite materials, hBN nanosheets can be used as stabilizers of emulsions for cosmetics and biological applications.

All absorbance spectra discussed below and illustrated in the drawings are for dispersion samples prepared by 24-hour bath sonication of crude DNA: BN nanomaterial of 1:1 mass ratio, then centrifuged at 17,000 g for 90 min to remove bundles and undispersed materials. All samples were diluted by 100 times for UV-vis absorbance measurements.

Figure 14:
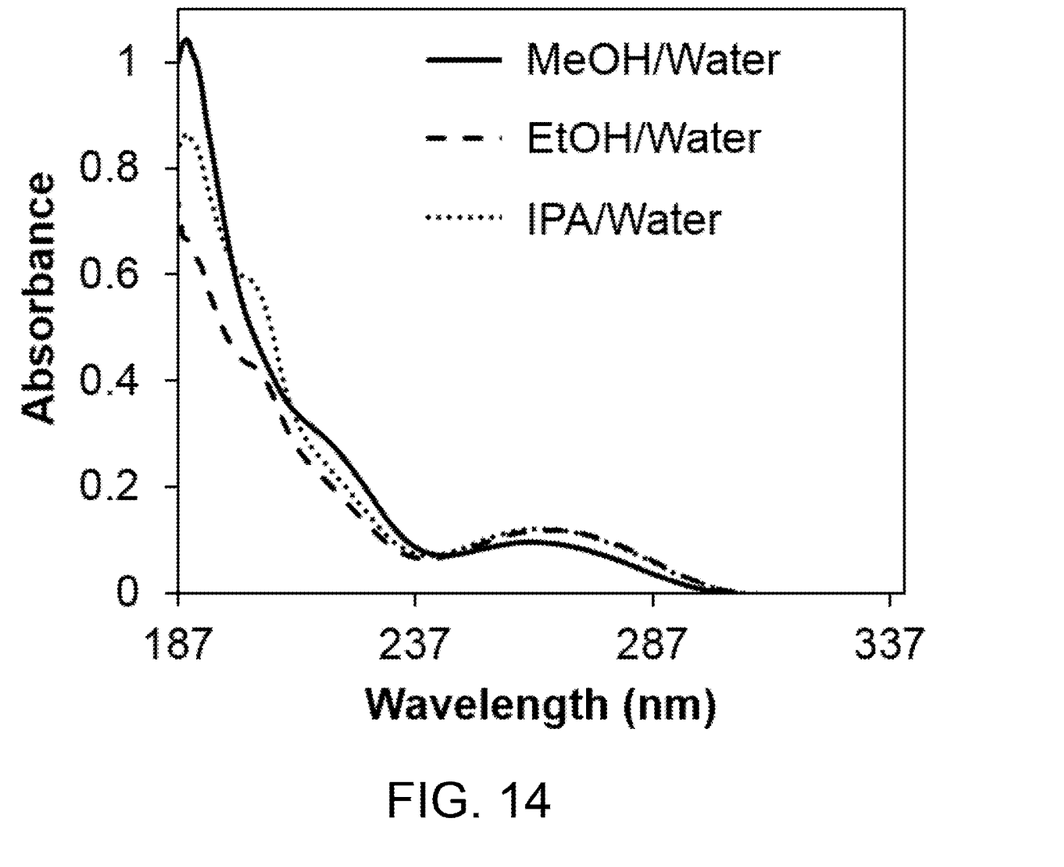
FIG. 14 is a graph showing absorbance spectra of dispersions of BNNTs stabilized by crude DNA in mixtures of different alcohols and water at 50/50 volume ratio.

FIG. 14 illustrates absorbance spectra of dispersions of BNNTs stabilized by crude DNA (herring sperm—crude oligonucleotides, <50 bp, Sigma Aldrich, D3159) in mixtures of alcohol and water at 50/50 volume ratio. Alcohols used include methanol (MeOH), ethanol (EtOH) and isopropyl alcohol (IPA).

Lower solvent polarity of alcohols assists the production of long, individually dispersed BNNTs by eliminating harsh tip sonication. The mixture of IPA/water showed slightly higher dispersion yield compared to those of MeOH/water and EtOH/water mixtures.

Figure 15A:
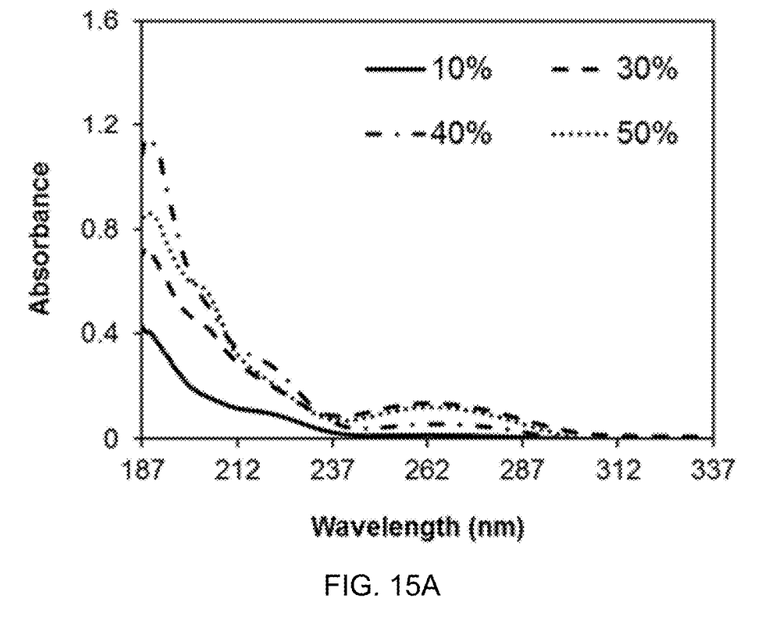
FIGS. 15A and 15B are graphs showing absorbance spectra of dispersions of BNNTs stabilized by crude DNA in IPA/water mixtures at different IPA volume %.
Figure 15B:
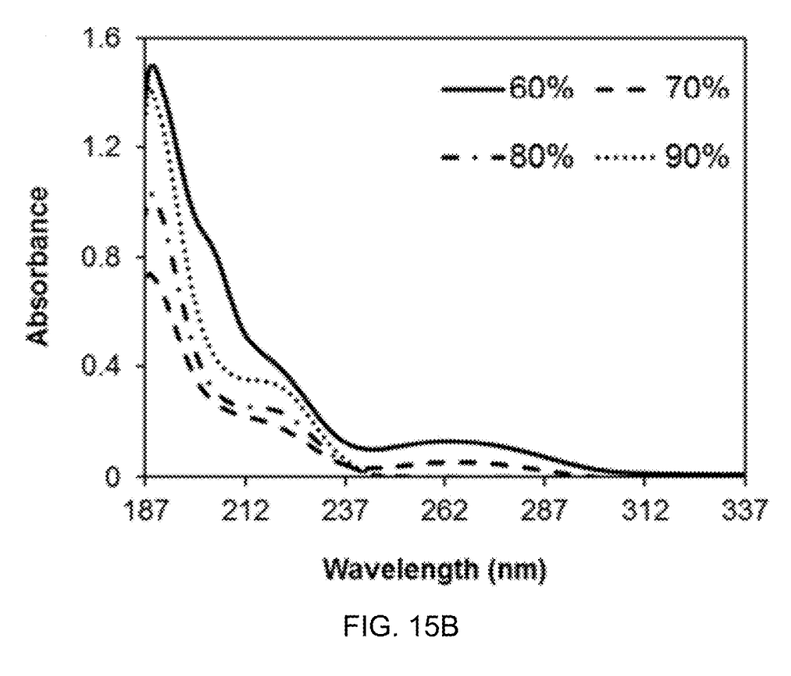

FIGS. 15A and 15B illustrates absorbance spectra of dispersions of BNNTs stabilized by crude DNA in IPA/water mixtures at different IPA volume %. Mixtures with IPA content of roughly 30-60 vol % (preferably 50-60 vol %) provides effective stabilization of BNNTs with improved dispersion yield. Solvents with too low (<10 vol %) or high (>70 vol %) alcohol content do not disperse BNNTs with the presence of DNA. Additionally, excessively high alcohol content may degrade DNA.

Figure 16:
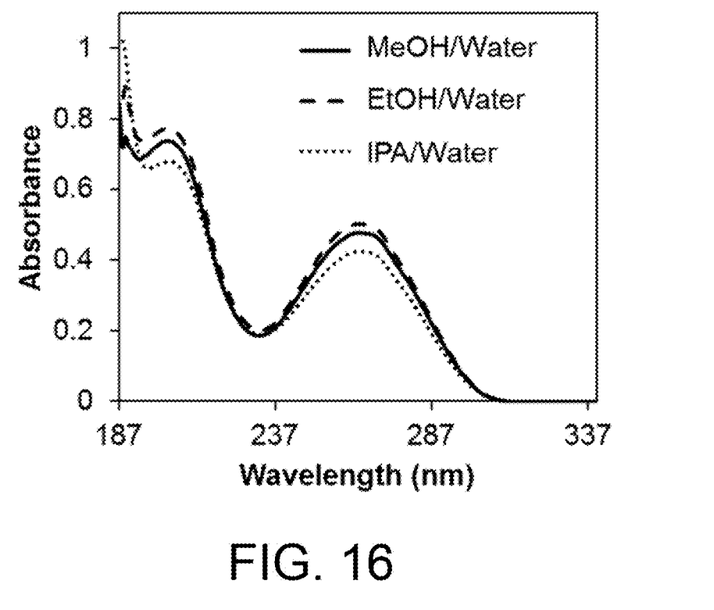
FIG. 16 is a graph showing absorbance spectra of hexagonal boron nitride (hBN) nanosheet dispersions stabilized by crude DNA in mixtures of different alcohols and water at 50/50 volume ratio without removing free DNA.

The following figures show the absorbance spectra of hBN dispersions stabilized by crude DNA in alcohol/water mixtures using the same method developed for BNNTs. Sample in FIG. 17 was prepared by first dispersing DNA-hBN in a EtOH/water mixture of 50/50 volume ratio, then exchange the solvent into ethanol only by membrane filtration to remove the initial solvent EtOH/water. During the process, excess unbound DNA was removed as well.

FIG. 16 illustrates absorbance spectra of hBN dispersions stabilized by crude DNA in mixtures of alcohol and water at 50/50 volume ratio. Alcohols used include methanol (MeOH), ethanol (EtOH) and isopropyl alcohol (IPA). The peak near 260 nm corresponds to the free DNA absorption. Here, unbound DNA was not removed from the dispersions. No obvious differences were observed for the type of alcohol used based on the dispersion yield of hBN nanosheets.

Figure 17:
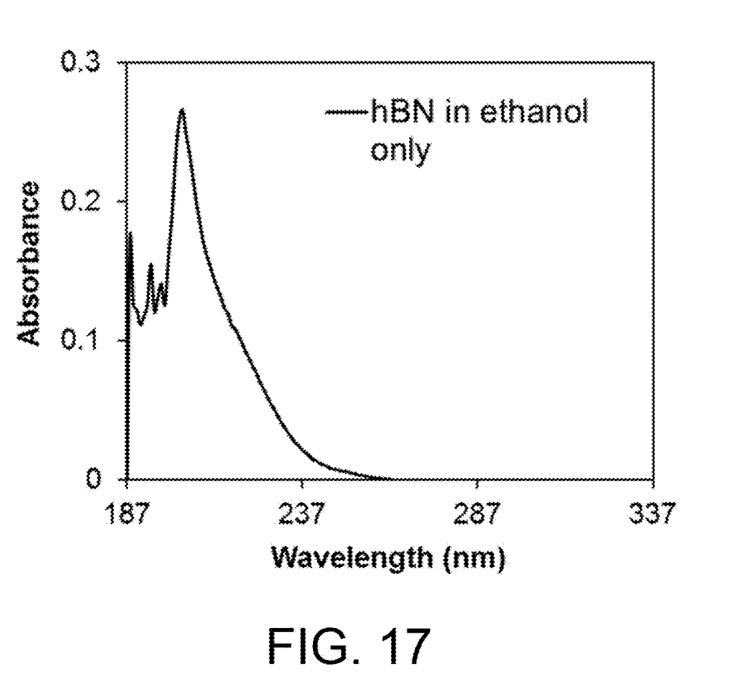
FIG. 17 is a graph showing absorbance spectrum of a hBN dispersion stabilized by crude DNA in ethanol only.

FIG. 17 illustrates absorbance spectrum of hBN dispersion stabilized by crude DNA in ethanol only.

The dispersion of BNNTs and hBN by DNA in alcohol/water mixtures is a tunable process that allows the control of free DNA and solvent contents as well as maintaining the physical size of starting materials to the largest extent due to mild bath sonication. This written description uses examples to describe the disclosure, including the best mode, and also to enable any person skilled in the art to make and use the disclosure. Other examples that occur to those skilled in the art are intended to be within the scope of the present disclosure if they have structural elements that do not differ from the same concept, or if they include equivalent structural elements with insubstantial differences. It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. A method for forming an aligned boron nitride nanotube film, the method comprising:
evaporating a solvent contained in a dispersion, the dispersion comprising:
boron nitride nanotubes;
single-stranded DNA represented by the formula $(GT)_n$,
wherein G is guanine,
wherein T is thymine, and
wherein n is a number of repeating units of at least 3 and at most 40; and
the solvent.

2. The method of claim 1, further comprising:
depositing the dispersion on a substrate prior to the evaporating.

3. The method of claim 2, wherein the substrate comprises a silicon wafer.

4. The method according to claim 1, further comprising:
purifying the dispersion prior to the evaporating.

5. The method of claim 4, wherein the purifying comprises membrane filtration.

6. The method of claim 4, wherein the purifying comprises centrifuging the dispersion to remove impurities.

7. The method of claim 4, wherein the purified dispersion comprises DNA-bound boron nitride nanotube hybrids in an amount of from about 0.03 mass % to about 11.5 mass % of the boron nitride nanotube hybrids.

8. The method of claim 1, further comprising:
mixing the boron nitride nanotubes, the single-stranded DNA, and the solvent to form the dispersion.

9. The method of claim 8, wherein the mixing comprises probe tip ultrasonication.

10. The method of claim 1, wherein the solvent comprises deionized water.

11. A method for forming an aligned boron nitride nanotube film, the method comprising:
depositing a dispersion on a substrate; and
evaporating a solvent contained in the dispersion,
wherein the dispersion comprises boron nitride nanotubes, DNA, and the solvent, and
wherein the substrate comprises at least one substrate material selected from the group consisting of a silicon wafer, copper, polytetrafluoroethylene, glass, and mica.

12. The method of claim 11, wherein the substrate comprises the silicon wafer.

13. A method for forming an aligned boron nitride nanotube film, the method comprising:
evaporating a solvent contained in a dispersion, the dispersion comprising:
boron nitride nanotubes;
single-stranded DNA represented by the formula,
wherein G is guanine,
wherein T is thymine, and
wherein n is a number of repeating units of at least 3 and at most 40; and
the solvent,
wherein a mass ratio of the boron nitride nanotubes to the single-stranded DNA in the dispersion is in the range of about 1:1 to about 2:1.

14. A method for forming an aligned boron nitride nanotube film, the method comprising:
mixing boron nitride nanotubes, single-stranded DNA, and a solvent to form a dispersion;
purifying the dispersion to remove impurities;
depositing the purified dispersion onto a substrate; and
evaporating at least a portion of the solvent to form the aligned film on the substrate,
wherein the single-stranded DNA is represented by the formula $(GT)_n$,
wherein G is guanine,
wherein T is thymine, and
wherein n is a number of repeating units of at least 3 and at most 40.

15. The method of claim 14, wherein the dispersion comprises from about 0.03 wt % to about 11.5 wt % of the boron nitride nanotubes.

16. The method of claim 14, wherein the purifying comprises at least one of membrane filtration and centrifugation.

17. The method of claim 14, wherein the mixing comprises probe tip ultrasonication.

18. The method of claim 14, wherein a mass ratio of the boron nitride nanotubes to the single-stranded DNA is in the range of about 1:1 to about 2:1.

19. A method for forming an aligned boron nitride nanotube film, the method comprising:
mixing boron nitride nanotubes, DNA, and a solvent to form a dispersion;
purifying the dispersion to remove impurities;
depositing the purified dispersion onto a substrate; and
evaporating at least a portion of the solvent to form the aligned film on the substrate,
wherein the substrate comprises at least one substrate material selected from the groups consisting of a silicon wafer, copper, polytetrafluoroethylene, glass, and mica.

20. The method of claim 19, wherein the substrate comprises the silicon wafer.

* * * * *